(12) United States Patent
Lusky et al.

(10) Patent No.: US 6,954,393 B2
(45) Date of Patent: Oct. 11, 2005

(54) READING ARRAY CELL WITH MATCHED REFERENCE CELL

(75) Inventors: Eli Lusky, Tel-Aviv (IL); Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 137 days.

(21) Appl. No.: 10/662,535

(22) Filed: Sep. 16, 2003

(65) Prior Publication Data

US 2005/0057953 A1 Mar. 17, 2005

(51) Int. Cl.⁷ .................................................. G11C 7/00
(52) U.S. Cl. .................................. 365/210; 365/185.03
(58) Field of Search ....................... 365/189.09, 185.03, 365/210

(56) References Cited

U.S. PATENT DOCUMENTS

| | | |
|---|---|---|
| 4,388,705 A | 6/1983 | Sheppard |
| 4,389,705 A | 6/1983 | Sheppard |
| 4,527,257 A | 7/1985 | Cricchi |
| 4,667,217 A | 5/1987 | Janning |
| 5,172,338 A | 12/1992 | Mehrotra et al. |
| 5,241,497 A | 8/1993 | Komarek |
| 5,289,412 A | 2/1994 | Frary et al. |
| 5,295,108 A | 3/1994 | Higa |
| 5,305,262 A | 4/1994 | Yoneda |
| 5,345,425 A | 9/1994 | Shikatani |
| 5,349,221 A | 9/1994 | Shimoji |
| 5,359,554 A | 10/1994 | Odake et al. |
| 5,418,743 A | 5/1995 | Tomioka et al. |
| 5,434,825 A | 7/1995 | Harari |
| 5,450,341 A | 9/1995 | Sawada et al. |
| 5,450,354 A | 9/1995 | Sawada et al. |
| 5,521,870 A | 5/1996 | Ishikawa |
| 5,537,358 A | 7/1996 | Fong |
| 5,568,085 A | 10/1996 | Eitan et al. |
| 5,583,808 A | 12/1996 | Brahmbhatt |
| 5,754,475 A | 5/1998 | Bill et al. |
| 5,768,193 A | 6/1998 | Lee et al. |
| 5,784,314 A | 7/1998 | Sali et al. |
| 5,812,449 A | 9/1998 | Song |
| 5,812,456 A | 9/1998 | Hull et al. |
| 5,828,601 A | 10/1998 | Hollmer et al. |
| 5,841,700 A | 11/1998 | Chang |
| 5,847,441 A | 12/1998 | Cutter et al. |
| 5,886,927 A | 3/1999 | Takeuchi |
| 5,946,258 A | 8/1999 | Evertt et al. |
| 5,949,728 A | 9/1999 | Liu et al. |
| 5,969,993 A | 10/1999 | Takeshima |
| 6,011,725 A | 1/2000 | Eitan |
| 6,034,896 A | 3/2000 | Ranaweera et al. |
| 6,118,692 A | 9/2000 | Banks |
| 6,128,226 A | 10/2000 | Eitan et al. |
| 6,134,156 A | 10/2000 | Eitan |
| 6,147,904 A | 11/2000 | Liron |
| 6,169,691 B1 | 1/2001 | Pasotti et al. |
| 6,205,056 B1 | 3/2001 | Pan et al. |

(Continued)

OTHER PUBLICATIONS

Eitan, U.S. Appl. No. 08/905,286, filed Aug. 1, 1997.

Primary Examiner—Vu A. Le
(74) Attorney, Agent, or Firm—Eitan Law Group

(57) ABSTRACT

A method for reading a bit of a memory cell in a non-volatile memory (NVM) cell array, the method comprising providing a memory cell comprising a bit to be read and at least one other bit not to be read, and reading the bit to be read with respect to a multi-bit reference cell, the reference cell comprising a first bit at a first non-ground programmed state and a second bit at a second non-ground programmed state. Compared with the prior art, the present invention may enable achieving the same sensing accuracy with improved read disturb immunity.

5 Claims, 1 Drawing Sheet

U.S. PATENT DOCUMENTS

| | | |
|---|---|---|
| 6,240,040 B1 | 5/2001 | Akaogi et al. |
| 6,307,807 B1 | 10/2001 | Sakui et al. |
| 6,317,364 B1 * | 11/2001 | Guterman et al. ..... 365/185.28 |
| 6,331,950 B1 | 12/2001 | Kuo et al. |
| 6,396,741 B1 | 5/2002 | Bloom et al. |
| 6,490,204 B2 | 12/2002 | Bloom et al. |
| 6,493,266 B1 * | 12/2002 | Yachareni et al. ..... 365/185.22 |
| 6,525,969 B1 * | 2/2003 | Kurihara et al. ....... 365/185.25 |
| 6,552,387 B1 | 4/2003 | Eitan |
| 2002/0132436 A1 | 9/2002 | Eliyahu et al. |
| 2002/0191465 A1 | 12/2002 | Maayan et al. |

* cited by examiner

READING ARRAY CELL WITH MATCHED REFERENCE CELL

SUMMARY OF THE INVENTION

The present invention relates generally to reading memory cells of non-volatile memory arrays, and particularly to methods for reading multi-bit memory cells with respect to reference cells.

BACKGROUND OF THE INVENTION

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of 1) and if the current output is below the reference, the cell is considered programmed (with a logical value of 0). (In terms of threshold voltage of the cell itself, programming a cell increases the threshold voltage of the cell, whereas erasing decreases the threshold voltage.)

Typically, a sufficient difference is defined between the expected erased and programmed voltage levels so that noise on the output will not cause false results. Accordingly, a program verify (PV) reference level and an erase verify (EV) reference level may be defined with a sufficient margin therebetween.

The margin may help maintain the same reading for the programmed or erased state of the cell. The margin may be necessary to overcome imperfections in the reading process and to compensate for drifts in the cell's threshold voltage (e.g., caused by retention loss or program/erase disturbs). A reduction in the original margin due to imperfections in the reading process (e.g., due to operation at different operational conditions) is referred to as "margin loss."

Many NVM arrays employ a reference cell as the basis for comparing the output of an array cell for a read operation. The use of a reference cell may help compensate for changes in the array, e.g., due to cycling and temperature, and ensure a fairly stable reference for read operations.

As is well known, NVM cells may have more than one bit, such as dual-bit or multi-bit cells. One example of a dual or multi-bit cell is a nitride, read only memory (NROM) cell, described in such patents as Applicant's U.S. Pat. No. 6,490,204, entitled "Programming And Erasing Methods For An NROM Array", and Applicant's U.S. Pat. No. 6,396,741, entitled "Programming Of Nonvolatile Memory Cells", the disclosures of which are incorporated herein by reference. Programming an NROM cell may typically involve applying positive voltages to gate and drain terminals of the transistor, while the source may be grounded. Erasing an NROM cell, which is done in the same source/drain direction as programming, typically involves applying a negative voltage to the gate and a positive voltage to the drain, while the source may be floated.

In dual-bit NROM cells, each bit may be read in the direction opposite to that of its programming direction, referred to as a "reverse read". For convenience of explanation, the bits are referred to as the left bit and the right bit. Accordingly, in order to read the left bit, the right bit line is the drain and the left bit line is the source. Conversely, in order to read the right bit, the cell is read in the opposite direction, meaning that the left bit line is the drain and the right bit line is the source.

The left bit and the right bit may be at different programmed states. For example, one of the bits may be programmed while the other may be erased. When reading one of the bits in the cell, voltages are applied to the bit lines and word line to which the drain, source and gate terminals of the memory cell are connected. In order to prevent the unread bit from erroneously affecting or disturbing the bit being read, it is generally accepted that a relatively large drain-source voltage Vds (e.g., above 1.4 V) should be applied. Such a high Vds ensures that the bit not being read has negligible effect on the bit being read.

However, using a relatively high drain to source voltage during read is not free of problems. Such a high Vds may cause a read disturb effect on the second bit of the dual bit cell, causing its threshold voltage to increase. For example, FIG. 1 illustrates the time for the threshold voltage (Vt) to drift upwards by 100 mV as a function of the drain-source voltage (Vds). For example, for Vds of about 1.6 V, it would take about $3 \times 10^7$ seconds for the threshold voltage to drift up approximately 100 mV. It is seen that as the drain-source voltage Vds increases, the time for the threshold voltage to drift upwards by 100 mV decreases. In other words, the higher the Vds, the quicker the threshold voltage drifts upwards. After a large number of read cycles, the threshold voltage may drift up an intolerable amount, leading to erase margin loss, i.e., a loss in the margin of voltage level between the erased state voltage level and the read reference level.

SUMMARY OF THE INVENTION

The present invention seeks to provide improved methods for reading bits of multi-bit memory array cells, which among other advantages, may diminish disturb effects on bits of the array, and provide better immunity from environmental effects (such as but not limited to, power supply fluctuations, temperature, and others). In accordance with an embodiment of the present invention, the read operation may be carried out with respect to bits of a multi-bit reference cell, whose bits are not at an initial, unprogrammed state, but rather are programmed to some read reference voltage level or levels. This better matches the reference cell state to that of the array cell.

The present invention is described herein for convenience sake with reference to an NROM dual-bit and multi-level cell. However, the present invention is not limited to such a cell and the invention is applicable for any kind of multi-bit NVM cell. The invention is particularly useful for an NROM device with two separated, localized charge packets. There is thus provided in accordance with an embodiment of the invention a method for reading a bit of a memory cell in a non-volatile memory (NVM) cell array, the method comprising providing a memory cell comprising a bit to be read and at least one other bit not to be read, and reading the bit to be read with respect to a multi-bit reference cell, the reference cell comprising a first bit at a first non-ground programmed state and a second bit at a second non-ground programmed state. The first and second programmed states may or may not be equal.

In accordance with an embodiment of the invention, a drain-to-source voltage (Vds) is used to read the bit to be read of the memory cell, and the method further comprises decreasing the drain-to-source voltage to obtain a current ratio greater than or equal to a predetermined amount, the current ratio being the ratio of a sensed output current of the memory cell to a current of the multi-bit reference cell used to read the memory cell.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
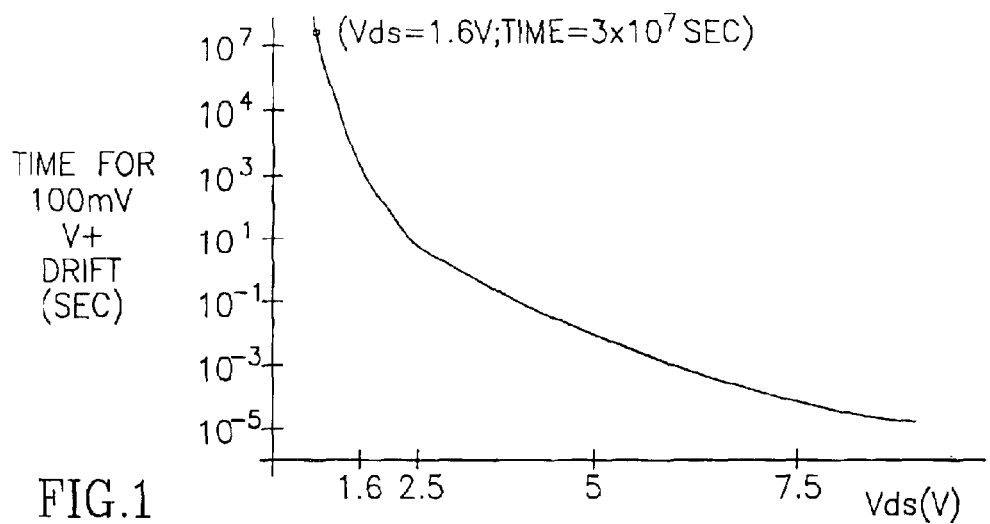
FIG. 1 is a simplified graphical illustration of the time required for 100 mV threshold voltage upward drift of a NVM cell as a function of the drain-source voltage used in reading the cell.
Figure 2:
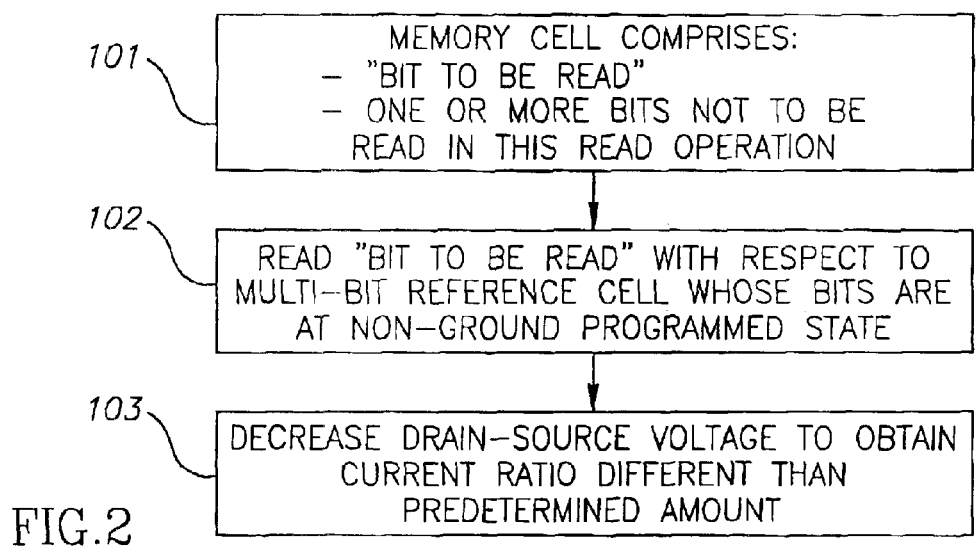
FIG. 2 is a simplified flow chart of a method for reading a bit of a memory cell, in accordance with an embodiment of the present invention.

Reference is now made to FIG. 2, which illustrates a method for reading a bit of a memory cell, in accordance with an embodiment of the present invention. The memory cell may comprise a bit to be read, and one or more other bits which are not to be read during this read operation (reference number 101 in FIG. 2). The other bits which are not read may be at erase or programmed states. The bit to be read may be in an erased state, which means that its threshold voltage is below a read reference level.

In the prior art, the bit to be read is read with respect to a first bit of a reference cell, which is at a read reference voltage level. A second bit of the reference cell is at an initial, unprogrammed state. In the initial state, the source is at or close to ground and ideally should remain close to ground. However, in real-world conditions that are not perfect, this initial state does not remain constant. For example, due to sensing and architecture array limitations, the source voltage generally increases during read operations. This may distort the sensed data due to a mismatch between the reference cell and the array cell.

In contrast in the present invention, the bit to be read is read with respect to a multi-bit reference cell (in this example, a dual-bit reference cell) whose first bit is at a first read reference voltage level (i.e., a first non-ground programmed state), and whose second bit is at some non-ground (at least partially) programmed state, such as a second read reference voltage level (reference number 102 in FIG. 2). The second read reference voltage level may or may not be the same as the first read reference voltage level.

Figure 3:
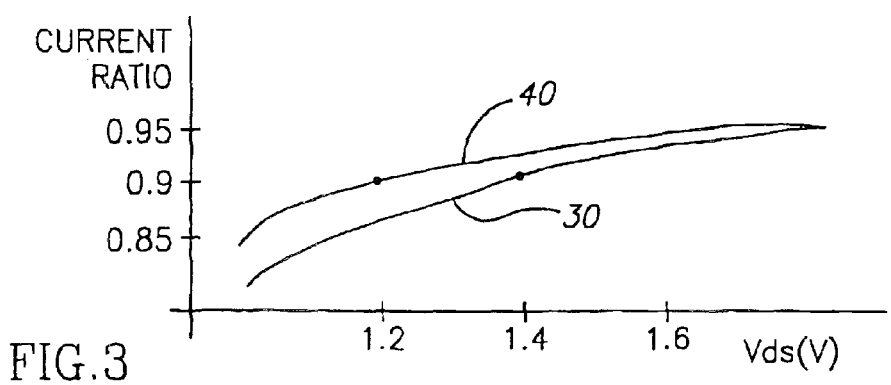
FIG. 3 is a simplified graphical illustration of a ratio of the sensed output current of an array cell to the current of a reference cell used to read the array cell, as a function of the drain-source voltage used to read the cell, in accordance with an embodiment of the invention.

Reference is now made to FIG. 3, which illustrates a ratio of the sensed output current of an array cell to the current of the reference cell used to read the array cell (referred to herein as the "current ratio"), as a function of the drain-source voltage (Vds) used to read the cell, in accordance with an embodiment of the invention.

In the design of a NVM array, it may be desirable to obtain a current ratio of a certain maximum magnitude, that is, a certain tolerable and acceptable current ratio loss. FIG. 3 illustrates an advantage of the present invention over the prior art, as is now explained.

Graph 30 is a plot of the current ratio vs. Vds for the case of reading an array cell whose first bit is at an erase/read level and whose second bit is programmed (that is, RD_PV) with respect to a reference cell of the prior art, whose first bit is at a read reference voltage level and whose second bit is at an initial, unprogrammed state (that is, RD_I). It is seen that for a given minimum current ratio, such as, for example, 0.90, in such a prior art read operation, Vds must be greater than or equal to 1.4 V.

Graph 40 is a plot of the current ratio vs. Vds for reading the same array cell (RD_PV) with respect to a reference cell of the present invention, whose first bit is at a first read reference voltage level and whose second bit is programmed to a read state (that is, RD_RD). It is seen that in order to attain the same minimum current ratio (in this example, 0.90), Vds needs only to be about 1.2 V. Thus, for a given current ratio loss, the invention enables application of a lower Vds. In other words, Vds may be decreased to obtain a different current ratio, such as greater than or equal to a predetermined amount (reference number 103 in FIG. 2). This also diminishes the read disturb effect on the second bit of the dual bit cell.

It will be appreciated by persons skilled in the art that the present invention is not limited by what has been particularly shown and described herein above. Rather the scope of the invention is defined by the claims that follow:

What is claimed is:

1. A method for reading a bit of a memory cell in a non-volatile memory (NVM) cell array, the method comprising:

providing a memory cell comprising a bit to be read and at least one other bit not to be read; and reading said bit to be read with respect to a multi-bit reference cell, said reference cell comprising a first bit at a first non-ground programmed state and a second bit at a second non-ground programmed state.

2. The method according to claim 1, wherein said first and second programmed states of the reference cell are substantially equal.

3. The method according to claim 1, wherein said first and second programmed states of the reference cell are not equal.

4. The method according to claim 1, wherein a drain-to-source voltage (Vds) is used to read the bit to be read of the memory cell, and the method further comprises decreasing the drain-to-source voltage to obtain a current ratio greater than or equal to a predetermined amount, said current ratio being the ratio of a sensed output current of said memory cell to a current of said multi-bit reference cell used to read said memory cell.

5. The method according to claim 1, wherein said memory cell comprises a nitride read only memory (NROM) cell.

* * * * *